United States Patent [19]

Bayraktaroglu

[11] Patent Number: 4,908,615

[45] Date of Patent: Mar. 13, 1990

[54] TRAFFIC LIGHT CONTROL SYSTEM AND METHOD

[75] Inventor: Burhan Bayraktaroglu, Plano, Tex.

[73] Assignee: Texas Instruments Incorporated, Dallas, Tex.

[21] Appl. No.: 230,205

[22] Filed: Aug. 9, 1988

Related U.S. Application Data

[63] Continuation-in-part of Ser. No. 67,527, Jun. 26, 1987.

[51] Int. Cl.[4] .............................................. G08G 1/08
[52] U.S. Cl. .................................. 340/917; 340/933; 343/700 MS
[58] Field of Search ............... 340/917, 933, 942, 943; 343/700 MS, 757, 759; 331/107 SL; 364/436; 455/73, 81

[56]     References Cited
        U.S. PATENT DOCUMENTS

| | | | |
|---|---|---|---|
| 2,965,893 | 12/1960 | Barker | 340/933 X |
| 3,782,446 | 1/1974 | McGimpsey | 340/917 |
| 3,811,128 | 5/1974 | Munson | 343/700 MS |
| 4,053,895 | 10/1977 | Malagisi | 343/700 MS |
| 4,255,730 | 3/1981 | Sekine et al. | 455/81 X |
| 4,317,117 | 2/1982 | Chasek | 343/6 ND |
| 4,370,718 | 1/1983 | Chasek | 364/436 |
| 4,405,925 | 9/1983 | Lindner et al. | 342/28 |
| 4,658,440 | 4/1987 | Pavio et al. | 455/319 X |
| 4,731,611 | 3/1988 | Muller et al. | 331/107 SL X |
| 4,791,428 | 12/1988 | Anderson | 343/757 |

FOREIGN PATENT DOCUMENTS 0190412  8/1986  European Pat. Off. ..... 343/700 MS

OTHER PUBLICATIONS

"Radar, Acoustic, and Magnetic Vehicle Detectors", Barker, IEEE Transactions on Vehicular Technology, vol. VT-19, No. 1, (Feb. 1970).
Dinger et al., "A 10 GHZ Space Power . . . ", 1986 IEEE MIT Symposium Digest, pp. 163-165.
Carver et al., "Microstrip Antenna Technology", IEEE Tran. Ant. and Prop., pp. 2-22, 1981.

Primary Examiner—Herbert Goldstein
Assistant Examiner—Brian R. Tumm
Attorney, Agent, or Firm—Melvin Sharp; James T. Comfort; Leo N. Heiting

[57]         ABSTRACT

Preferred embodiments include a radar traffic light control system with a transmitter/receiver module including an array (103) of interconnected microstrip patch antennas (38) which also act as the resonators for oscillators powered by IMPATT diodes (34, 36); varactors (158) on the interconnections permit beam steering for scanning roadways.

8 Claims, 7 Drawing Sheets

TRAFFIC LIGHT CONTROL SYSTEM AND METHOD

STATEMENT AS TO RIGHTS TO INVENTIONS MADE UNDER FEDERALLY SPONSORED RESEARCH AND DEVELOPMENT

The U.S. Government has a paid-up license in this invention and the right in limited circumstances to require the patent owner to license others on reasonable terms as provided for by the terms of Contract No. DAAL01-86-C-0002 awarded by the U.S. Army.

CROSS-REFERENCE TO RELATED APPLICATIONS

This application is a continuation-in-part of U.S. patent application Ser. No. 067,527, filed June 26, 1987 (TI-12675 Bayraktaroglu). U.S. patent application Ser. No. 082,027, filed Aug. 5, 1987 (TI12919 Bayraktaroglu and Camilleri), discloses related subject matter. These cross-referenced applications are assigned to the assignee of the present application.

BACKGROUND OF THE INVENTION

1. Field of the Invention.

The present invention relates to traffic light control systems, and, more particularly, to monolithic microwave and millimeter wave devices automobile traffic light control systems.

2. Description of the Related Art.

Traffic lights regulate roadway intersection traffic with a view to both safety and smoothness of vehicular flow. A typical traffic light control system for the intersection of a secondary street with a major thoroughfare includes a sensor in the pavement of the secondary street to detect the presence or speed of vehicles. Typically, the sensor includes a loop of wire imbedded in the pavement and detects the presence of a vehicle over the loop by the change of the inductance of the loop. The loop is part of a tuned circuit; so the presence of a vehicle is detected by the detuning of the circuit. The inductive loop detector is basically a presence detector, and to obtain other information such as speed and traffic spacing or to get early warning of an approaching vehicle, multiple loops in a single lane can be used. The use of presence detectors permits avoidance of cycling the traffic lights to green for the secondary street if no vehicles are waiting during the red. However, the sensor loops are expensive to install and to interface with the traffic light control box; and the loops must be replaced every three to five years with severe winter weather responsible for the shortest lifetimes.

Various radar and sonar traffic light control systems have been proposed. For example, U.S. Pat. No. 4,317,117 discloses a combination of Doppler radar and passive infrared sensor with the the Doppler radar powered by a discrete microwave tunnel diode feeding a waveguide and horn antenna through a probe coupler. The Doppler signal indicates movement and the infrared signal indicates presence. Similarly, the same inventor in U.S. Pat. No. 4,370,718 discloses a discrete tunnel diode, Gunn diode, Barritt diode or field effect transistor to generate microwave power and, optionally, also mix the returning Doppler shifted signal. Although the frequency of operation of the radar can be any frequency, higher frequencies are preferred to minimize the antenna size for a given beam width. The identification of individual vehicles requires that the beam width should not exceed approximately three degrees. Such beam widths are obtained with antennas 70 cm and 7 cm in diameter at 10 GHz and 100 GHz, respectively. Another consideration is that the radar signal frequency should be located in one of the high atmospheric attenuation windows in the frequency spectrum. Such high attenuation windows are centered at, for example, 60 GHz and 115 GHz.

Microwave and millimeter wave transmitters are usually designed around discrete components. A transmitter requires a power source (free-running or controlled oscillator) and a radiating element (antenna); however, the technologies typically used to fabricate the oscillator and the antenna are incompatible. Thus hybrid transmitters with the oscillator and the antenna on separate substrates is standard. Monolithic millimeter wave oscillators often use IMPATT diodes with the frequency of oscillation determined by circuit impedance and specific diode conditions or by injection-locking signals; and the oscillator power is typically coupled out by a microstrip transmission line and fed into a microstrip patch or waveguide antenna. See for example R. Dinger et al, A 10 GHz Space Power Combiner with Parasitic Injection Locking, 1986 IEEE MTT Symposium Digest 163 and K.Carver et al, Microstrip Antenna Technology, 29 IEEE Tr. Ant. Prop. 2 (1981). For a transmitter operating over a band of frequencies, the antenna and the oscillator are designed for close impedance match throughout the bandwidth of operation to minimize mismatch losses.

However, the known transmitters have the problems of mismatch losses, design difficulties, and hybrid fabrication cost and difficulties, and this translates into problems for traffic light control systems of low frequency operation and maintainence and replacement costs.

SUMMARY OF THE INVENTION

The present invention provides a traffic light control system including a monolithic microwave or millimeter wave transmitter/receiver made of an array of coupled active antennas with the power source, its impedance matching circuits, and the radiating element of each antenna on a single semiconductor chip by combination of the oscillator resonator with radiating element so that the properties of these two elements match automatically. The array of individual active antennas provides a narrow beam that can be steered either by phase adjustment in the coupling of the individual antennas or by mechanical steering. Because the individual oscillator and its radiator are an integrated unit, there are no mismatch losses. Further, in preferred embodiments each oscillator is a free-running IMPATT diode on a semi-insulating gallium arsenide (GaAs) substrate with a halfwavelength microstrip patch radiating element also fabricated on the same semi-insulating GaAs substrate; the dimensions of the patch determine both the frequency of oscillation and the frequency of radiation for automatic matching. The antennas are coupled by transmission lines, and varactors may be included for beam steering. The diodes also perform the local oscillator and mixer functions for signals received by the antenna. Other active devices such as the varactors for beam steering may be integrated on the same GaAs substrate.

The use of a radiating element also as a resonator for a microwave or millimeter wave oscillator in a traffic light control system solves the problems of cost and replacement and permits high frequency for high resolution weather independent operation.

BRIEF DESCRIPTION OF THE DRAWINGS

The drawings are schematic for clarity.

DESCRIPTION OF THE PREFERRED EMBODIMENTS

Figure 1A:
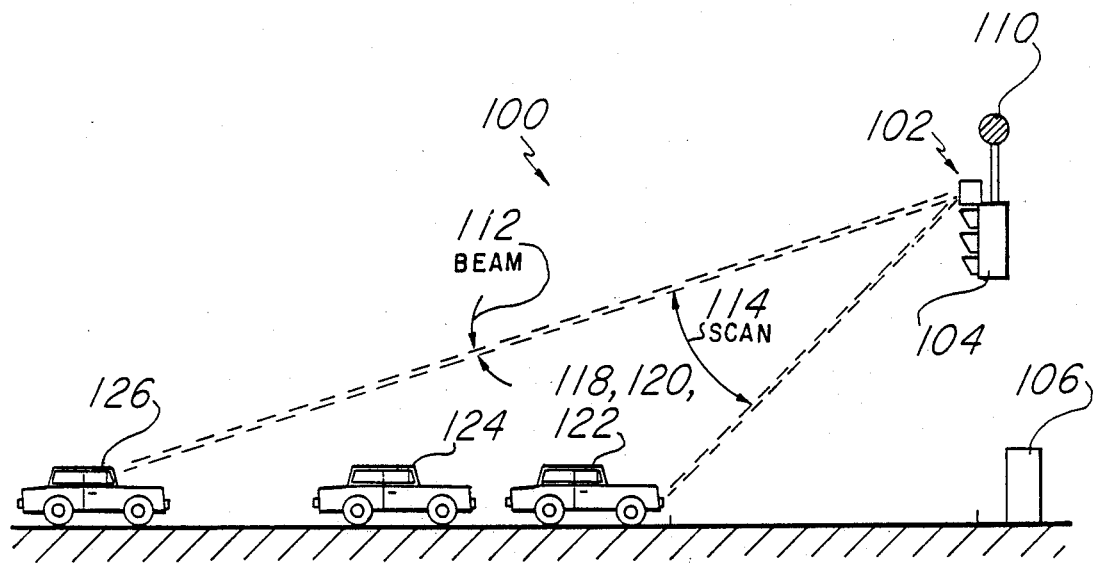
FIGS. 1a–c are elevation, plan, and system views of a first preferred embodiment traffic light control system.

FIGS. 1ya–b illustrate in elevation and plan views a first preferred embodiment traffic light control system, generally denoted by reference numeral 100, which includes transmitter/receiver module 102 mounted on suspended traffic lights 104 and control box 106 which is electrically connected to module 102 and traffic lights 104 through wiring inside pole 108 and cantilever arm 110. Module 102 transmits a 60 GHz, 25 mW microwave beam 112 with a 3 dB halfwidth of three degrees in both the horizontal and vertical directions. Beam 112 is scanned both horizontally 116 and vertically 114 to detect the presence of vehicles 118, 120, and 122 stopped at the illustrated roadway intersection and also the approach of vehicles 124 and 126 to the intersection. At a distance of 100 meters from module 102 the beam has a 3 dB halfwidth spot size of about 5.2 meters. 60 GHz is a convenient frequency due to absorption by molecular oxygen which provides high attenuation. FIG. 1b also indicates loop 98 which would lead to detection of vehicle 120 by known inductance sensors.

Figure 1B:
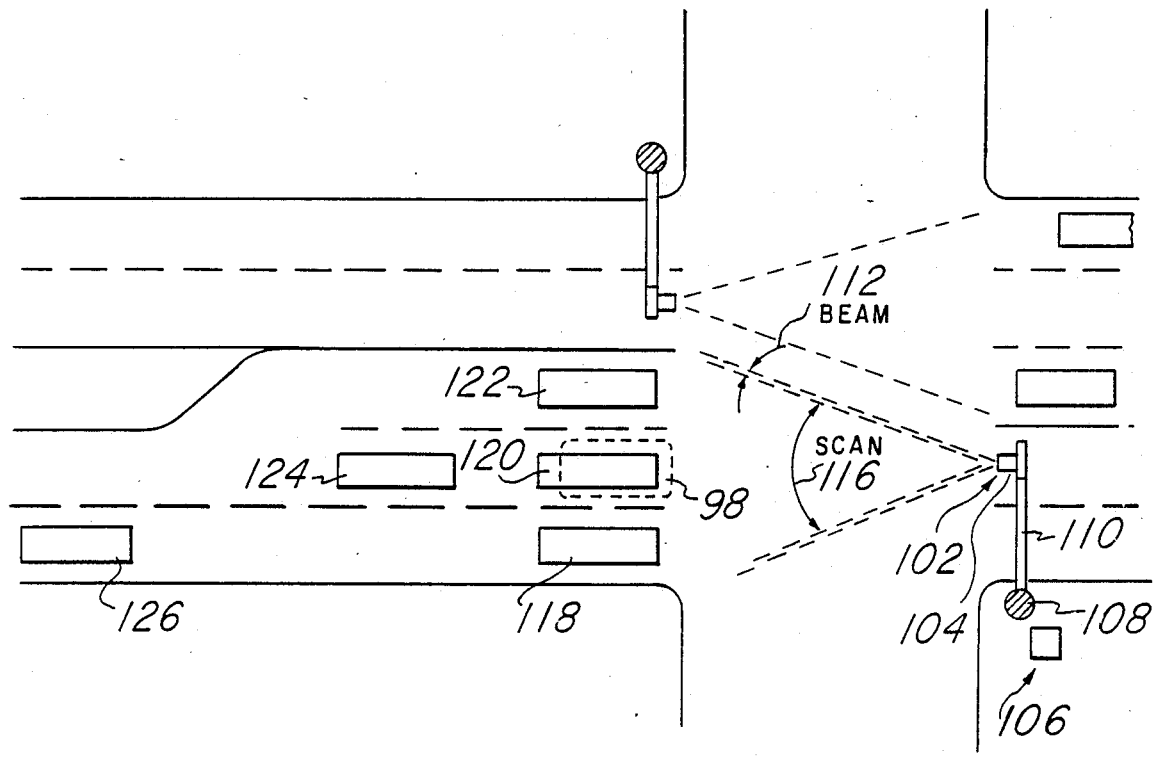
Figure 1C:
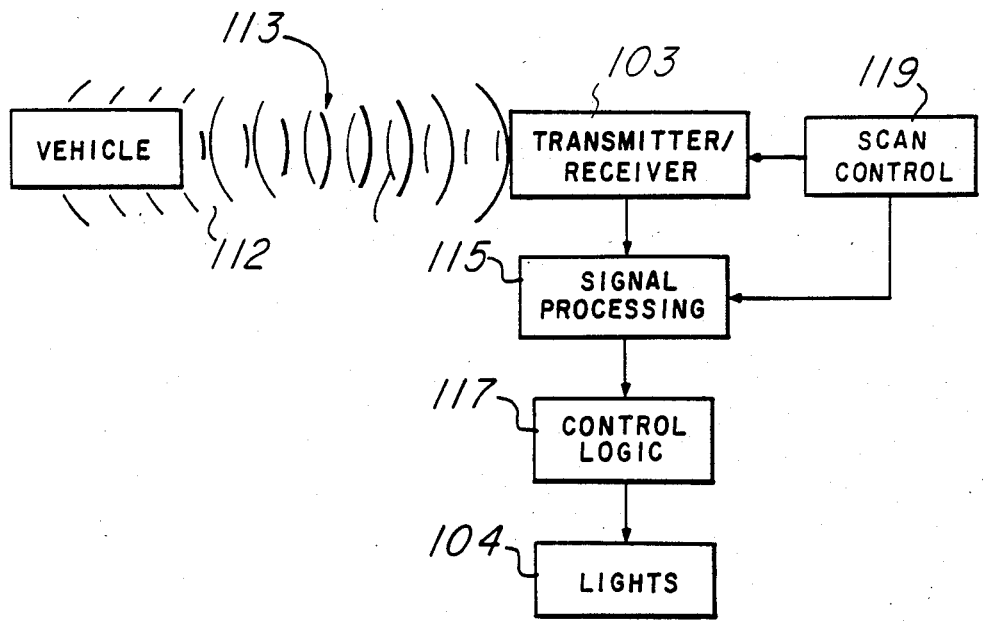

FIG. 1c schematically illustrates the traffic light control system of FIGS. 1a–b which can be operated either as a Doppler radar to detect vehicles approaching the intersection or as a frequency-modulated continuous-wave radar or pulsed radar to detect the presence of vehicles near the intersection. Reflected beam 113 is detected by the same antenna as radiated beam 112, and the output signal is processed by signal processor 115 which inputs the processed signal to control logic 117 which, in turn, controls the illumination of lights 104. The scan control 119, signal processor 115 and logic 117 can be located in control box 106, or the scan control plus some signal processing and logic may be incorporated into module 102.

In addition to the microwave transmitter and receiver circuits, all radar systems require lower frequency signal processing circuits to interpret the radar signal. Such circuits are connected to the intermediate frequency (IF) output terminal of the receiver. In module 102 the IF signal is obtained from the dc bias line; a capacitive coupling will transfer the IF to the processing circuitry while isolating the dc bias. A signal processing circuit may contain an analog-to-digital converter to digitize the analog signal, memory circuits, and a microprocessor to compute the location of vehicles. The output of the signal processing is then input to the logic circuits that control the light sequences at the intersection. Exemplary circuitry is shown in U.S. Pat. Nos. 4,317,117 and 4,370,718 cited in the Background.

Figure 2A:
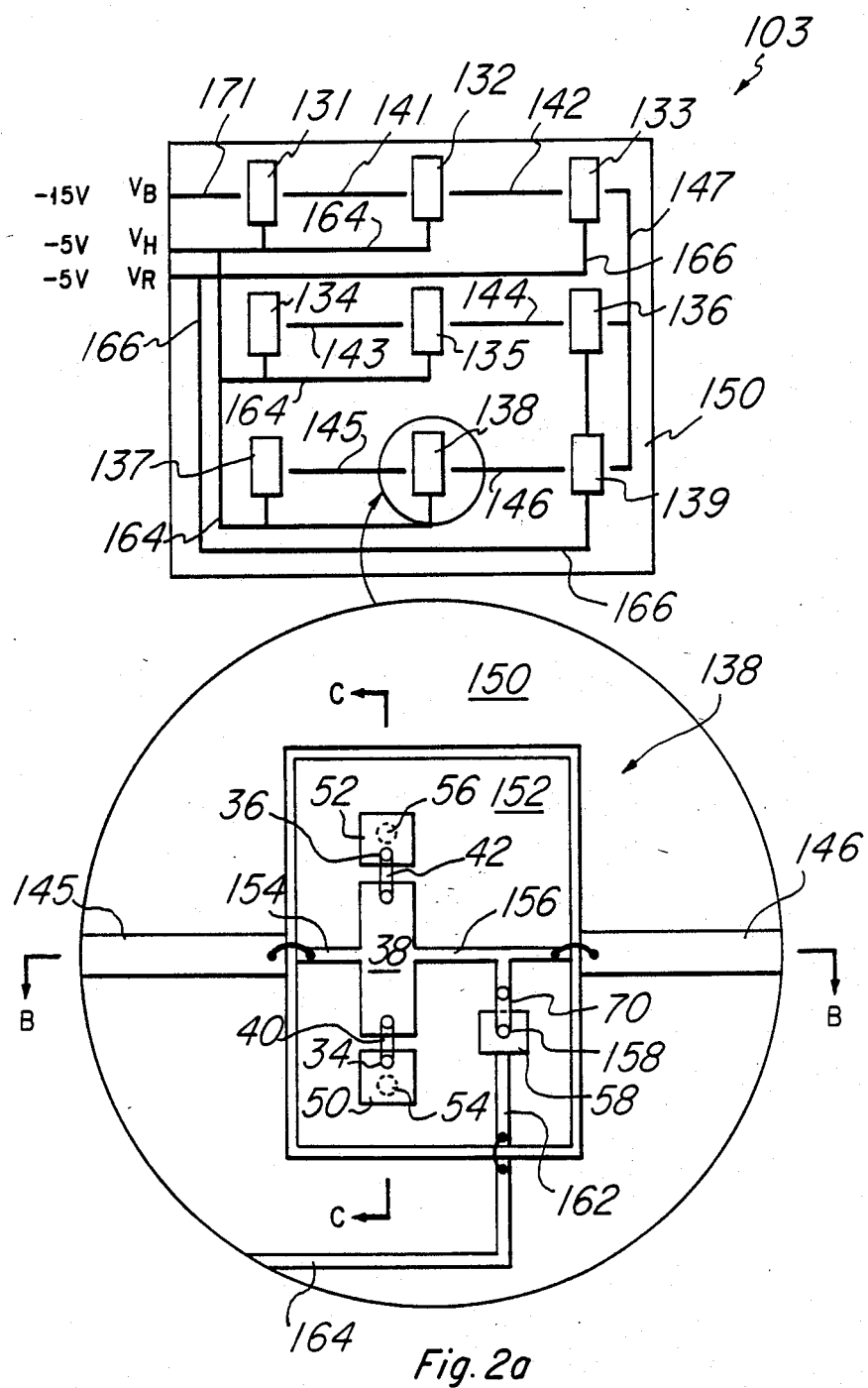
FIGS. 2a–c illustrate the first preferred embodiment active antenna array.

FIG. 2a is a plan view of a first preferred embodiment array 103 included in module 102 and which includes a three by three array of nine individual active antennas 131,132, . . . , 139 connected together by a network of 50 ohm transmission line segments: six horizontal transmission lines 141, 142, . . . , 146 and one vertical transmission line 147. Varactor bias line 164 supplies external voltage $V_H$ for adjustment of the electrical length between horizontally adjacent active antennas and varactor bias line 166 supplies external voltage $V_R$ for adjustment of the electrical length between adjacent rows of active antennas.

Figure 2B:
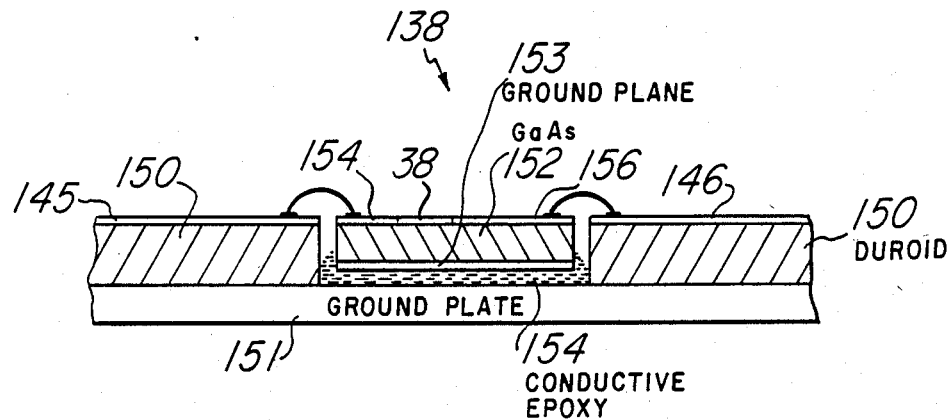
Figure 2C:
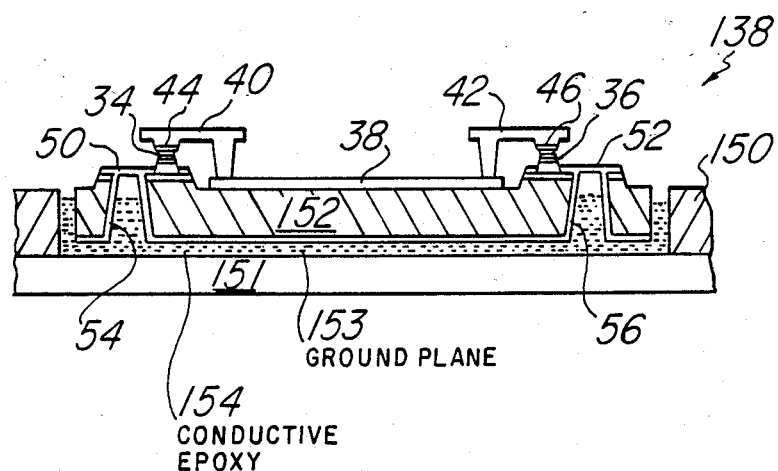

Active antenna 138 is representative of the nine active antennas and, as shown in plan view in the FIG. 2a insert and in cross sectional elevation views in FIGS. 2b–c, is formed on a semi-insulating gallium arsenide (GaAs) substrate 152. Active antenna 138 includes microstrip patch 38, power IMPATT diodes 34 and 36, 50 ohm transmission line segments 154 and 156 plus varactor diode 158 loading segment 156 and varactor bias line 162. Substrate 152 is affixed by conductive epoxy 154 in an opening in Duroid ™ (a compound of Teflon and fiberglass) layer 150 on metal ground plate 151; note that substrate 152 has a backside plated ground plane 153 so epoxy 154 electrically connects ground plane 153 to ground plate 151. 50 ohm transmission line segments 141, 142, . . . , 147 are formed on Duroid (a compound of Teflon and fiberglass) 150 and are wire bonded to the corresponding segments on the active antenna substrates (e.g., 145 is wire bonded to 154 and 146 is wire bonded to 156). Varactor bias line 164 on Duroid (a compound of Teflon and fiberglass) 150 is wire bonded to line 162 on substrate 152 as are the other varactor bias lines to the corresponding lines on the active antenna substrates.

In more detail, active antenna 138 includes semi-insulating gallium arsenide (GaAs) substrate 152, IMPATT diodes 34 and 36, halfwavelength microstrip patch 38, air bridges 40 and 42 connecting diodes 34 and 36 to patch 38, respectively, metal top contacts 44 and 46 for diodes 34 and 36, respectively, metal bottom contacts 50 and 52 for diodes 34 and 36, respectively, metallized vias 54 and 56 connecting backside ground plane 153 to bottom contacts 50 and 52, respectively, and varactor diode 158 plus air bridge 70 connecting it to transmission line segment 156. For operation about 60 GHz, patch 38 is about 600 μm long (vertical direction in FIG. 2a insert and horizontal direction in FIG. 2c) by about 200 μm wide by 2 μm thick, substrate 152 is 125 μm thick, diodes 34 and 36 are each 5 μm in diameter and 1.2 μm high, and air bridges 40 and 42 are about 20 μm long and 5 μm wide, so the horizontal separation of patch 38 from the diodes 34 and 36 is about 10 μm. Patch 38 together with ground plane 153 form a cavity that radiates. The direct current to bias diodes 34 and 36 (and all other power IMPATT diodes in the other active antennas) into breakdown is supplied through high impedance line 171 from an external voltage supply $V_B$ to active antenna 131 and from there through the 50-ohm transmission lines to the other active antennas; note that the dominant mode in the patch cavity has an electric field null in the middle where the 50 ohm transmission lines connect to patch 38, so minimal power loss occurs due to the bias arrangement. Indeed, the location of 50 ohm transmission line segments 154 and 156 on patch 38 may be adjusted towards either end of patch 38 to increase the coupling. 50 ohm transmission line segments 154 and 156 are about 50 μm wide; whereas, segments 141, 142, . . . , 147 are much wider due to the lower dielectric constant and greater thickness of Duroid (a compound of Teflon and fiberglass) 150 (about 175 μm) compared to GaAs substrate 152.

Analysis of a general rectangular microstrip patch antenna may be made using a modal-expansion cavity model if the substrate is electrically thin. Applicant's copending application serial no. 067,527, filed June 26, 1987, provides a summary of this analysis and is hereby incorporated by reference. The far-field radiation pattern in the $TM_{10}$ mode can be modelled as two parallel uniform magnetic line sources of length a (corresponding to the short ends of patch 38) separated by distance b (the length of patch 38).

The design of active antenna 138, given the substrate material and thickness and a desired frequency, f, generally follows the steps of (1) selecting the length b of patch 38 as half of the desired substrate wavelength multiplied by a length reduction factor q to account for fringing fields and the loading by diodes 34 and 36:

$$b = q \frac{c}{2f\sqrt{\epsilon}},$$

(2) selecting the width a of patch 38 by computing an approximate cavity sidewall impedance as a function of a and adjusting a so that this impedance matches the free space impedance of 377 Ω, and (3) computing the Q of the cavity; if the Q is too low the resonator effect is poor and if the Q is too high the antenna is not efficient. To change the Q requires revising the original substrate thickness data provided that the same substrate material and frequency of operation are still desired. If the substrate thickness is adjusted, then b and a are recomputed.

In practice, computer simulations such as SUPER-COMPACT ™ for a variety of a and b values compute oscillation frequency and antenna efficiency and, in effect, design the transmitter. Note that if the frequency is very high (100 GHz) the permitted effective thickness of the substance is limited by the rule of thumb of demanding that the second harmonic is still a TM mode and not a surface mode. A thin substrate implies small a. Although a substrate with a smaller dielectric constant (such as Teflon with a constant about 2.4) and lower loss tangent than GaAs would be preferable from a pure antenna point of view, GaAs is a compromise that permits monolithic integration of the diodes and antenna plus other devices.

The operation of array 103 is as follows. An external bias of about −15 volts relative to ground is applied to line 171, and this biases all of the power diodes (34, 36, . . . ) into breakdown. Each pair of power diodes 34 and 36 together with the adjoining patch 38 form a resonant circuit that radiates as described supra, with natural frequencies of oscillation that are fairly close together. The 50-ohm transmission lines segments 141, 142, . . . , and 147 couple all of these radiating patches 38 to lock them to a common frequency and also determine the phase relations among them by the electrical lengths of the segments. In particular, all of the horizontal segments 141, 142, . . . , 146 are of the same physical length and loaded by one of the varactor diodes 158. Because the varactor diodes 158 are all biased by a common external voltage $V_H$ supplied to bias line 164, the electrical lengths between adjacent horizontal patches 38 are all the same and controlled by $V_H$. $V_H$ is varied about a center voltage of approximately −5 volts relative to ground (so varactor diodes 158 have a reverse bias centered about 10 volts). The physical length of the segments 141, 142, . . . , 146 are chosen so that at the common frequency of oscillation with $V_H$ at center voltage the electrical length of the segments (including the portions 154 and 156 on the substrate 152) is an integral multiple of the wavelength. For example, at a frequency about 60 GHz, the free space wavelength is about 5 mm and the wavelength on a microstrip transmission line having a Duroid (a compound of Teflon and fiberglass) dielectric is about 2.5 mm, so a physical separation of horizontally adjacent patches 38 of 50 mm would be 20 wavelengths. Similarly, the electrical length between the rows of active antennas is controlled by external voltage $V_R$ and the physical length of the two halves of 50-ohm transmission line 147 plus the 156 segments on substrates 152, and for a center voltage of $V_R$ the physical length is also taken to be 20 wavelengths (50 mm). Thus the beam width will be about 3.5 degrees, and the overall dimensions of array 103 will be about 100 mm square. Note that the adjacent patches would be about 10 free space wavelengths apart. Individual active antennas may provide up to 10 mW of power, so the power output of array 103 can easily achieve 25 mW of beam power which is sufficient for detection of vehicles up to 100 meters away.

Varying the varactor bias voltages $V_H$ and $V_R$ permits scanning of beam 112 as shown in FIGS. 1a–b; the horizontal range of scan 116 can be increased for the portions of the roadway closest to module 102. Typically, a scan angle of 33 degrees from the undeflected beam direction suffices for detecting both close in vehicles and vehicles up to 100 meters away. To deflect beam 112 through an angle 33 degrees (0.58 radian) requires a change of the electrical length of each of transmission line segments 141, 142, . . . , 146 or each half of transmission line segment 147 by about 5.8 wavelengths ($0.58 \times 10\lambda_{freespace}$). Thus a change of the capacitance of varactors 158 of 0.1 pF is needed and can be achieved by varactor 158 (which has a diameter of about 10–15 μm) with a change of about 2 volts from a center reverse bias of 10 volts.

The active antennas also function as the receiver. The power diodes 34, 36 provide the local oscillator (LO) and mixer functions, whereas the patch 38 is used for receiving and modifying the impedance of incoming signals for optimum reception sensitivity. The low frequency mixed signal is taken out along the dc bias line 171. Further, the active antennas may operate in a pulsed transmit/receive mode as follows: first the diodes are biased for power generation at a frequency $f_1$ and a pulse is transmitted at this frequency, then the diode bias is changed (which changes the diode small signal conductance and susceptance) to change the resonant frequency to $f_2$. The antenna then receives a signal arising from the reflection of the transmitted pulse at $f_1$ which is mixed by the diodes (which are nonlinear) with $f_2$ to create the output signal.

Figure 3A:
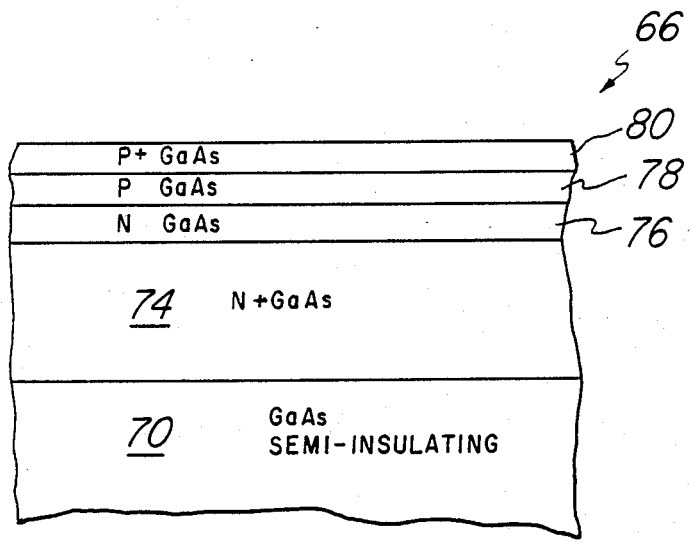
FIGS. 3a–f are cross sectional elevation views of a first preferred embodiment method of fabrication of the first preferred embodiment active antenna array.

Further characteristics of active antennas 131, 132, . . ., 139 may be understood from a consideration of a first preferred embodiment method of fabrication which includes the following steps:

(a) Grow a single crystal semiconductor multilayer structure 66 by molecular beam epitaxy (MBE), metal organic chemical vapor deposition (MOCVD), or similar techniques beginning with gallium arsenide (GaAs) substrate 70 and adding successive layers with composition, thickness, and doping level as set forth in the following table; see FIG. 3a for a cross sectional view.

| Layer | Composition | Thickness | Doping (cm$^{-3}$) |
|---|---|---|---|
| 70 | GaAs | large | undoped |
| 74 | $\eta^+$ GaAs | 1.5 $\mu$m | $1 \times 10^{19}$ |
| 76 | $\eta$ GaAs | 0.25 $\mu$m | $2 \times 10^{17}$ |
| 78 | $\rho$ GaAs | 0.25 $\mu$m | $2 \times 10^{17}$ |
| 80 | $\rho^+$ GaAs | 0.2 $\mu$m | $1 \times 10^{19}$ |

Note that MBE and MOCVD with in situ doping provides very sharp junctions between the drift layers 78 and 80; this avoids the fall off of negative conductance at high frequencies associated with doping transition region at the junction. GaAs substrate 70 is semiinsulating.

Figure 3B:
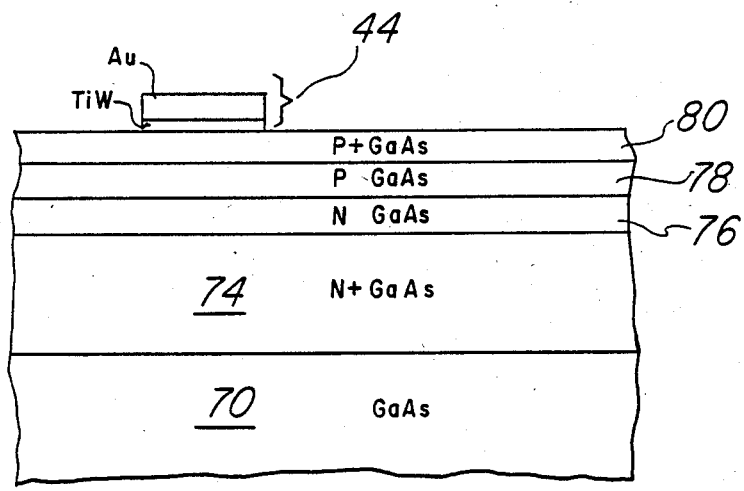

(b) Form power diode top contacts 44 and 46 plus varactor diode top contact by spinning on photoresist and patterning it to define top contacts 44 and 46 plus the varactor diode top contact as circles 5 $\mu$m in diameter, sputtering 0.1 $\mu$m of TiW (an alloy of about 10% titanium and 90% tungsten) and 0.4 $\mu$m of gold, and etching off around the patterned photoresist so as to leave contacts 44 and 46 plus varactor diode top contact. See FIG. 3b which only shows contact 44. The gold is primarily to prevent oxidization of the TiW, and the TiW chosen for its good adherence to and low metallurgical reaction with GaAs.

Figure 3C:
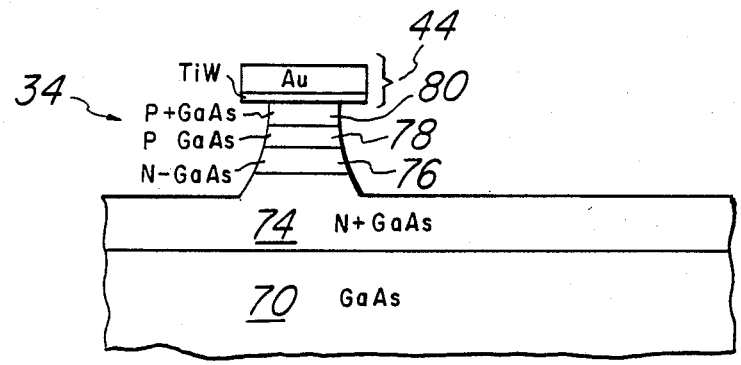

(c) Etch layers 80, 78, 76, and 74 with the top contacts as the etch mask by a timed wet etching to stop in layer 74; this forms diodes 34, 36, and 158 with a base diameter of 5 $\mu$m. The etchant may be a solution of hydrogen peroxide with five percent ammonium hydroxide, and the large thickness of layer 74 allows for ease of stopping the etch in layer 74. The isotropic nature of this etch leads to an overhang by the top contacts; see FIG. 3c and note that the vertical scale is exaggerated for clarity so the characteristic circular isotropically etched surface under the overhang appears pyramidal.

Figure 3D:
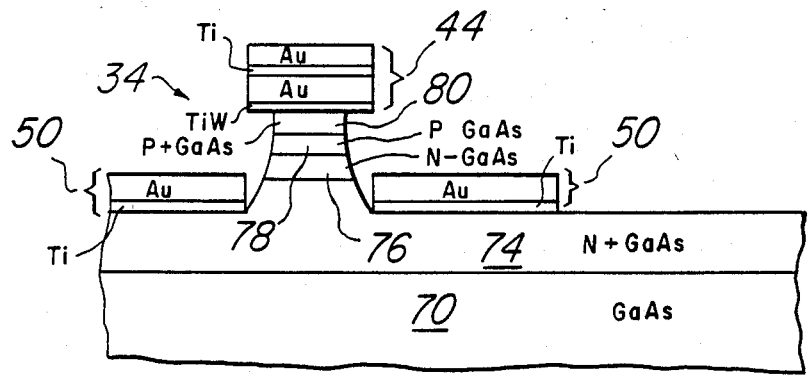

(d) Form diode bottom contacts 50, 52, and 58 by spinning on photoresist and patterning it to define contacts 50, 52 and 58 as squares with 75 $\mu$m edges, evaporating 0.1 $\mu$m of titanium and 0.4 $\mu$m of gold, and lifting off the patterned photoresist and the metal on it. Diode top contacts 44 and 46 plus the varactor diode top contact act as masks during the evaporation and lead to self-aligned bottom contacts 50, 52 and 58 due to the overhangs; see FIG. 3d. The top contacts are all increased in thickness by the evaporations, and the self-aligned nature of bottom contacts 50, 52 and 58 minimizes parasitic series resistance.

Figure 3E:
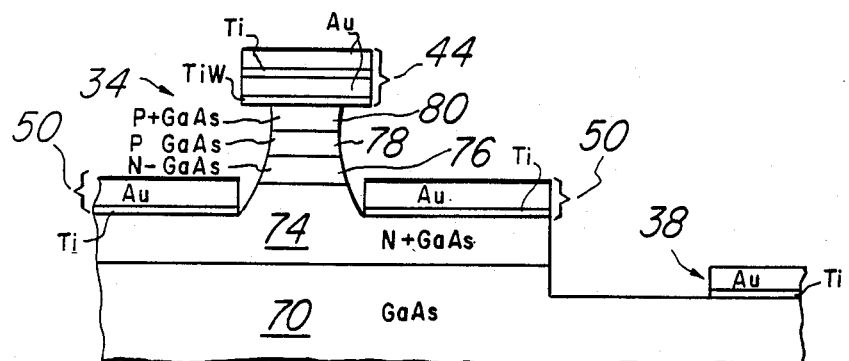

(e) Anisotropically plasma etch layer 74 and 0.1 $\mu$m of substrate 70 using the metal contacts 44, 46, 50, 52, 58 and varactor diode top contact as etch mask. This isolates the diodes on mesas on semiinsulating substrate 70. Form microstrip patch 38 on substrate 70 again by evaporation and liftoff of a 0.1 $\mu$m thick layer of titanium followed by a 0.4 $\mu$m thick layer of gold. See FIG. 3e which shows the just diode 34 and a small portion of patch 38.

Figure 3F:
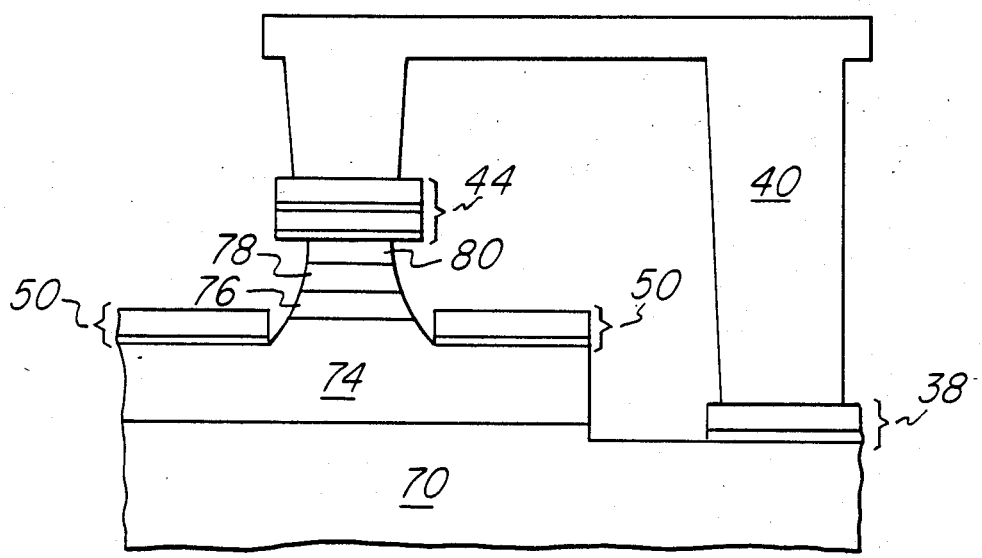

(f) Form air bridges 40, 42 and 70 by spinning on photoresist, patterning openings to the top contacts, evaporating thin layers of titanium and gold, spinning on further photoresist, patterning the same openings plus the bridging connections between the openings, and plating gold to a thickness of 2.0 $\mu$m on the exposed gold. Remove the photoresist which also lifts-off the thin titanium and gold between the two layers of photoresist. See FIG. 3f.

(g) Lap substrate 70 down to a thickness of 125 $\mu$m to form substrate 152. Form vias 54 and 56 in the backside of substrate 152 by photoresist masking and reactive ion etching, the etch stops on bottom contacts 50 and 52. Lastly, gold plate the backside, including vias 54 and 56 to form ground plane 153.

The individual active antenna chips are then epoxied into openings in the Duroid (a compound of Teflon and fiberglass) 150-on-metal plate 151 transmission line network with a conductive epoxy 154 to join ground planes 153 with ground plate 151. Then the wire bonds are added to complete array 103.

Figure 4:
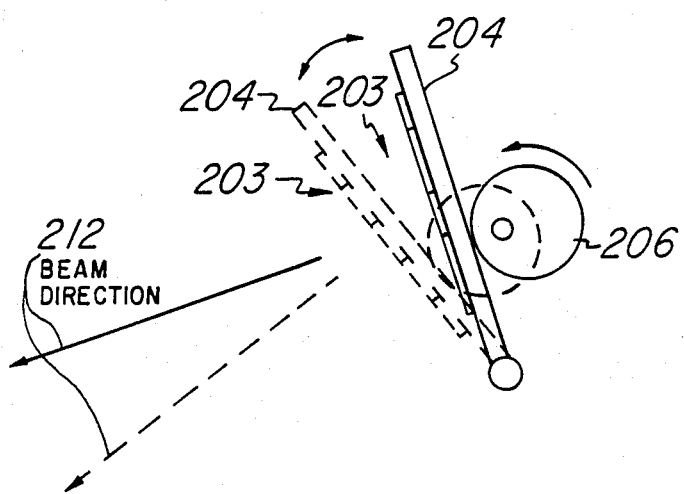
FIG. 4 illustrates in cross sectional elevation view a second preferred embodiment system array.

A second preferred embodiment system has a mechanical scan for transmitter/receiver module 102 and thus eliminates the need for the varactors 158 and external biases $V_H$ and $V_R$ in array 103. In particular, FIG. 4 illustrates in cross sectional elevation view a simple mechanical actuator for beam scanning which may be employed for secondary roads where the detection of the presence of vehicles in a single lane is needed. In this case, the array 203 is mounted on a platform 204 engaging cam 206 which translates rotational movement from a continuously operating motor to vertical scanning movement for platform 204. The solid lines and dashed lines show the extreme positions of array 203 and beam 212.

If horizontal scanning is also required as in multiple lane roads, then either a second mechanical means may be added to the cam drive of FIG. 4 or varactors may be included in array 203 for electronic horizontal scanning. Because the horizontal scan must be greater for close in vehicles than for distant vehicles, the electronic scanning alternative may be preferred.

Third preferred embodiment system has an array similar to 103 but with no varactors and no scanning. The transmitter/receiver module detects vehicles passing a fixed point (such as 50 meters from the intersection) in one lane, and the control logic simply counts the number of vehicles. Light control algorithms such as cycling the lights if the number of vehicles counted since the last green light exceeds three could be used. For a multilane roadway, one third preferred embodiment array for each lane could be used with each array transmitting at a difference frequency.

MODIFICATIONS AND ADVANTAGES

Various modifications of the preferred embodiment devices and methods may be made while retaining the features of a compact transmitter/receiver for mounting on traffic light fixtures that combines oscillator resonator and radiating element for the active antennas of an array.

For example, the dimensions and shapes and materials of the various elements may be varied such as: circular or other geometry microstrip patches; only a single diode connected to the resonator/radiator if the capacitance of the diode is small compared to the capacitance of the resonator to retain approximate symmetry; multiple diodes connected to either or both ends of the resonator/radiator; connections without the use of air bridges or air bridges from the power diode to ground; larger or smaller arrays of active devices (such as rectangular arrays for beams narrower in one direction); Ga-As-on-silicon, InP, $Al_xGa_{1-x}As$ heterostructure or other semiconductor material; other power devices including BARITT, TRAPATT, and DOVETT diodes, Gunn diodes, tunnel diodes or three terminal devices with negative resistance regions, or other monolithic active devices for oscillator power; and monolithic coupled arrays of oscillators/radiators. Further variations are shown in applicant's copending application Ser. No. 067,527, filed June 26, 1987 are hereby incorporated by reference.

The invention provides the advantage of simple, rugged, compact radar for traffic light control vehicle detection.

What is claimed is:

1. A traffic light control system, comprising:
   (a) a transmitter/receiver, said transmitter/receiver for transmitting a beam towards a roadway, detecting reflections of said beam from vehicles on said roadway, and outputting a detection signal; and
   (b) circuitry connected to said transmitter/receiver, said circuitry converting said detection signal into traffic light control signals;
   (c) said transmitter/receiver including an array of active antennas, each of said active antennas having:
      i. an oscillator including a power source and a resonator; and
      ii. a radiator coinciding with said resonator;
   (d) said transmitter/receiver further including interconnections among said active antennas, said interconnections coupling said active antennas together.

2. The system of claim 1, wherein:
   (a) said active antennas are imbedded in a transmission line network; and
   (b) said interconnections include transmission lines of said network.

3. The system of claim 1, wherein:
   (a) said power source is a plurality of IMPATT diodes biased into breakdown;
   (b) said resonator is a microstrip patch; and
   (c) said diodes and patch are formed on a single semiconductor substrate.

4. The system of claim 3, wherein:
   (a) said substrate is gallium arsenide with a metallized ground plane on the backside;
   (b) said diodes are formed on mesas on said substrate;
   (c) said diodes are connected to said patch by air bridges; and
   (d) said diodes are connected to said ground plane through vias in said substrate.

5. The system of claim 1, further comprising:
   (a) varactors connected to said interconnections, whereby beam steering may be achieved by changing electrical lengths of said interconnections.

6. The system of claim 5, wherein:
   (a) each of said active antennas is formed on a single substrate; and
   (b) said varactors are located on said substrates.

7. The system of claim 1, further comprising:
   (a) a mechanical actuator attached to said array for steering said beam.

8. The system of claim 1, further comprising:
   (a) varactors connected to said interconnections; and
   (b) a mechanical actuator attached to said array;
   (c) whereby beam steering may be achieved by changing electrical lengths of said interconnections and changing the orientation of said array.

* * * * *